United States Patent [19]
Isao et al.

[11] Patent Number: 5,605,776
[45] Date of Patent: Feb. 25, 1997

[54] PHASE-SHIFTING PHOTOMASK BLANK, PHASE-SHIFTING PHOTOMASK, AND METHOD OF MANUFACTURING THEM

[75] Inventors: Akihiko Isao; Susumu Kawada; Atsushi Hayashi, all of Chichibu; Nobuyuki Yoshioka; Kazuyuki Maetoko, both of Itami, all of Japan

[73] Assignees: Ulvac Coating Corporation, Chichibu; Mitsubishi Denki Kabushiki Kaisha, Tokyo, both of Japan

[21] Appl. No.: 515,165

[22] Filed: Aug. 15, 1995

[30] Foreign Application Priority Data

Mar. 24, 1995 [JP] Japan ................................. 7-091401

[51] Int. Cl.⁶ ............................................. G03F 9/00
[52] U.S. Cl. ................. 430/5; 430/313; 427/99; 427/255.2; 427/255.3; 216/48
[58] Field of Search .................. 430/5, 313; 427/255.2, 427/255.3, 99; 156/646, 652

[56] References Cited

U.S. PATENT DOCUMENTS

| | | |
|---|---|---|
| 4,661,426 | 4/1987 | Matsuda et al. . |
| 5,286,581 | 2/1994 | Lee . |

FOREIGN PATENT DOCUMENTS

| | | |
|---|---|---|
| 6-347996 | 12/1994 | Japan . |
| 7-43888 | 2/1995 | Japan . |
| 7-140635 | 6/1995 | Japan . |

OTHER PUBLICATIONS

M. Nakajima et al., "Attenuated phase–shifting mask with a single–layer absorptive shifter of CrO, CrON, MoSiO and MoSiON film", The International Society for Optical Engineering, vol. 2197, pp. 111–121, 1994.

Y. Saito et al., "Attenuated phase shift mask blanks with oxide or oxi–nitride of Cr or MoSi absorptive shifter", The International Society for Optical Engineering, vol. 2254, pp. 61–63, 1994.

N. Yoshioka et al., "Practical attenuated phase–shifting mask with a single–layer absorptive shifter of MoSiO and MoSiON for ULSI fabrication", International Electron Devices meeting 1993, Washington, D.C., Dec. 8, 1993.

*Primary Examiner*—S. Rosasco
*Attorney, Agent, or Firm*—Armstrong, Westerman, Hattori, McLeland & Naughton

[57] ABSTRACT

A phase-shifting photomask blank has a transparent substrate, a phase-shifting film deposited on the transparent substrate, the phase-shifting film including a transversely central composition which results in a reduced rate of side etching, and a patterned photoresist film masking the phase-shifting film. When the phase-shifting film is dry-etched through the patterned photoresist film into a desired circuit pattern, transversely different rates of side etching of the phase-shifting film are substantially equalized due to the reduced rate of side etching resulting from the transversely central composition. The circuit pattern includes openings defined by removal of the phase-shifting film and shifters left between the openings. The shifters have respective side surfaces free of steps and extending substantially perpendicularly from the transparent substrate. If the phase-shifting film comprises a film of molybdenum silicide oxide nitride deposited by sputtering, then the proportion of a nitrogen mono oxide gas in a sputtering gas is adjusted to control the transversely central composition of the phase-shifting film.

28 Claims, 8 Drawing Sheets

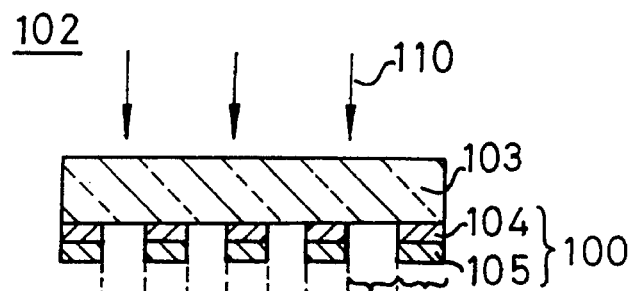
FIG.2(a)
(PRIOR ART)
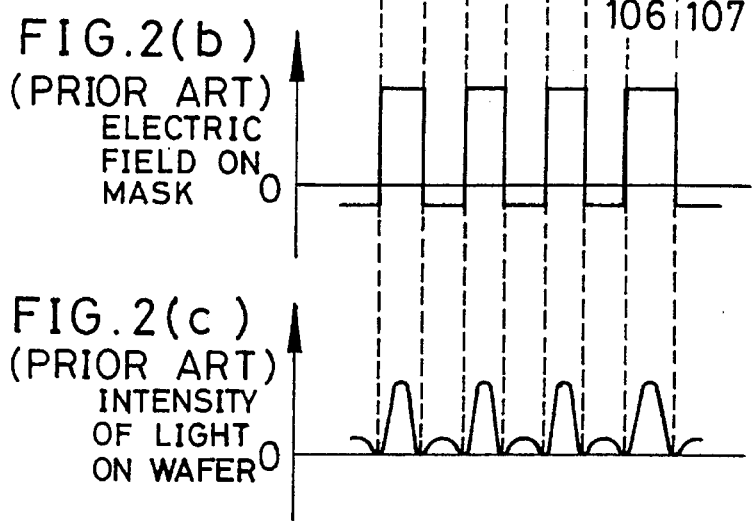
FIG.2(b)
(PRIOR ART)
ELECTRIC
FIELD ON
MASK
FIG.2(c)
(PRIOR ART)
INTENSITY
OF LIGHT
ON WAFER
FIG.3
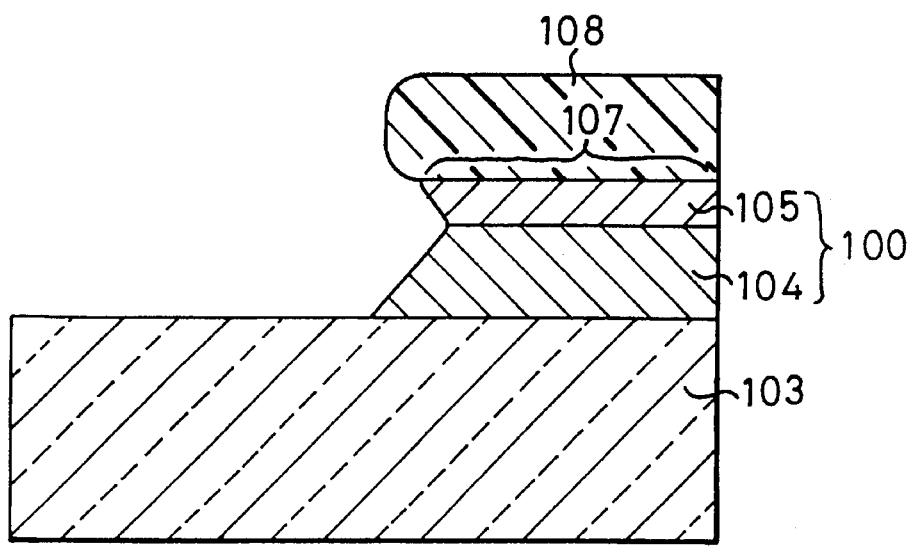

PHASE-SHIFTING PHOTOMASK BLANK, PHASE-SHIFTING PHOTOMASK, AND METHOD OF MANUFACTURING THEM

BACKGROUND OF THE INVENTION

1. Field of the Invention

The present invention relates to a phase-shifting photomask blank and a phase-shifting photomask for use in a projection exposure apparatus, and methods of manufacturing such a phase-shifting photomask blank and a phase-shifting photomask, and more particularly to a phase-shifting photomask blank and a phase-shifting photomask which have a phase-shifting film whose composition varies in the transverse direction thereof, and methods of manufacturing such a phase-shifting photomask blank and a phase-shifting photomask.

2. Description of the Prior Art

One process of manufacturing a conventional phase-shifting photomask will be described below with reference to FIGS. 1(a) through 1(c) of the accompanying drawings. First, as shown in FIG. 1(a), a phase-shifting layer 104 of molybdenum silicide oxide nitride (MoSiON) is grown on a surface of a transparent substrate 103 of quartz. Then, as shown in FIG. 1(b), a protective layer 105 of molybdenum silicide oxide nitride, which has a different composition from that of the phase-shifting layer 104, is deposited on the phase-shifting layer 104. The phase-shifting layer 104 and the protective layer 105 jointly serve as a phase-shifting film 100. The phase-shifting film 100 and the transparent substrate 103 make up a phase-shifting photomask blank 101. Thereafter, as shown in FIG. 1(c) the phase-shifting film 100 is selectively etched away by dry etching, using a patterned photoresist film 108 (see FIG. 3 of the accompanying drawings) on the protective layer 105. After being thus selectively etched, the phase-shifting film 100 has openings 106 through which the surface of the transparent substrate 103 is exposed and lands positioned as shifters 107 between the openings 106. The openings 106 and the shifters 107 jointly make up a desired circuit pattern. The assembly thus formed serves as a phase-shifting photomask 102.

The phase-shifting film 100 is generally required to have a sufficiently high light transmittance with respect to exposure light in a short wavelength range, e.g., of a wavelength of 248 nm, used to achieve a highly accurately circuit pattern. At the same time, the phase-shifting film 100 is also required to have a sufficiently low light transmittance with respect to light in a longer wavelength range, e.g., of a wavelength of 488 nm, used to inspect the phase-shifting film 100 for any defects.

An exposure step in the process of manufacturing the phase-shifting photomask is accompanied by cleaning the phase-shifting photomask with a chemical. Therefore, the protective layer 105 is required to be highly resistant to the chemical used, and also to be capable of adjusting the phase angle of the phase-shifting layer 104 to achieve a desired phase angle for the phase-shifting film 100 in its entirety.

A photolithographic process effected on a semiconductor wafer, for example, using the phase-shifting photomask 102 will be described below with reference to FIGS. 2(a) through 2(c) of the accompanying drawings. As shown in FIG. 2(a), rays of exposure light 110 are applied to the reverse side of the phase-shifting photomask 102, transferring the circuit pattern on the phase-shifting photomask 102 onto the semiconductor wafer based on the difference between intensities of the exposure light 110 that has passed through the openings 106 and the shifters 107.

If the exposure light 110 that has passed through the openings 106 and the exposure light 110 that has passed through the shifters 107 are out of phase with each other by $\pi$ (rad.), as shown in FIG. 2(b), then the intensity of the exposure light 110 that reaches the surface of the semiconductor wafer is nil in the vicinity of the boundaries between the openings 106 and the shifters 107 as shown in FIG. 2(c). Consequently, it is possible to transfer a highly accurate, fine circuit pattern from the phase-shifting photomask 102 to the semiconductor wafer.

It is known that the phase-shifting angle $\phi$ (rad.) of the phase-shifting photomask 102 is expressed by:

$$\phi = 2\pi \cdot (n_1 - n_0) \cdot d_1 \lambda + 2\pi \cdot (n_2 - n_0) \cdot d_2 / \lambda \tag{1}$$

where $n_0$ is the refractive index of a medium (which air in normal usage), refractive index $n_0$ of air being 1, $\lambda$ is the wavelength of exposure light, $d_1$ and $d_2$ are the thicknesses of the phase-shifting layer 104 and the protective layer 105, respectively, and $n_1$ and $n_2$ are the refractive indexes of the phase-shifting layer 104 and the protective layer 105, respectively. The thicknesses $d_1$, $d_2$ of the phase-shifting layer 104 and the protective layer 105 are selected such that the phase-shifting angle $\phi$ is $\pi$ at the wavelength $\lambda$ of the exposure light that is actually used.

While the phase-shifting film 100 of the above conventional phase-shifting photomask 102 is composed of the two layers 104, 105, the phase-shifting film of another phase-shifting photomask may be composed of three or more layers. At any rate, the light transmittance of the phase-shifting film is normally in the range of from 4% to 20% in order to produce an adequate intensity of exposure light for photolithography and adjust the film thickness, after being developed, of a resist film coated on the semiconductor wafer.

For satisfying both desired optical characteristics and chemical-resistance requirements of the phase-shifting film, it has been the general practice to construct the phase-shifting mask of either a number of layers having different compositions or a thin film whose composition gradually varies, rather than a film having a single composition.

However, when a number of layers having different compositions or a thin film whose composition gradually varies is patterned into a desired circuit by dry etching, the produced circuit pattern tends to be inaccurate in shape or lack pattern sections, resulting in defective phase-shifting photomasks.

A study to find causes of such inaccurate circuit pattern shapes or lost pattern sections in the conventional phase-shifting film 100 has indicated that when the phase-shifting film 100 is selectively etched by dry etching to produce the shifters 107, each of the shifters 107 is recessed centrally in its transverse direction as shown in FIG. 3 and has a concave side surface which does not lie perpendicular to the transparent substrate 103.

The recess in the concave side surface is produced because of different rates of side etching of the phase-shifting film 100 in its transverse direction. Specifically, the layers of the phase-shifting film 100 are subjected to side etching at different rates, respectively. The concave side surface of the phase-shifting film 100 tends to lower the controllability of the light transmittance of the phase-shifting film 100 at an end of each of the shifters 107, and make the end of each of the shifters 107 and hence the circuit pattern inaccurate in shape. Furthermore, since the overhanging region above the recess in the concave side surface can easily be broken at the end of each of the shifters 107, the circuit pattern is liable to lose pattern sections.

Consequently, there have been demands for finding solutions for such problems.

SUMMARY OF THE INVENTION

It is therefore an object of the present invention to provide a phase-shifting photomask blank and a phase-shifting photomask which satisfy desired optical characteristics and chemical-resistance requirements, have an accurate circuit pattern, and are free of lost pattern sections, and methods of manufacturing such a phase-shifting photomask blank and a phase-shifting photomask.

According to the present invention, there is provided a method of manufacturing a phase-shifting photomask blank, comprising the steps of depositing a phase-shifting film on a transparent substrate such that the phase-shifting film includes a transversely central composition which results in a reduced rate of side etching, masking the phase-shifting film with a patterned photoresist film, and dry-etching the phase-shifting film through the patterned photoresist film while substantially equalizing transversely different rates of side etching of the phase-shifting film due to the reduced rate of side etching resulting from the transversely central composition.

According to the present invention, there is also provided a phase-shifting photomask blank comprising a transparent substrate, a phase-shifting film deposited on the transparent substrate, the phase-shifting film including a transversely central composition which results in a reduced rate of side etching, and a patterned photoresist film masking the phase-shifting film, the arrangement being such that when the phase-shifting film is dry-etched through the patterned photoresist film, transversely different rates of side etching of the phase-shifting film are substantially equalized due to the reduced rate of side etching resulting from the transversely central composition.

According to the present invention, there is further provided a method of manufacturing a phase-shifting photomask, comprising the steps of depositing a phase-shifting film on a transparent substrate such that the phase-shifting film includes a transversely central composition which results in a reduced rate of side etching, masking the phase-shifting film with a patterned photoresist film, and dry-etching the phase-shifting film through the patterned photoresist film into a circuit pattern to be transferred onto a wafer, while substantially equalizing transversely different rates of side etching of the phase-shifting film due to the reduced rate of side etching resulting from the transversely central composition, the circuit pattern including openings defined by removal of the phase-shifting film and shifters left between the openings.

According to the present invention, there is also provided a phase-shifting photomask comprising a transparent substrate, and a phase-shifting film deposited on the transparent substrate, the phase-shifting film including a transversely central composition which results in a reduced rate of side etching, the phase-shifting film being dry-etched, while being masked by a patterned photoresist film, into a circuit pattern to be transferred onto a wafer, the arrangement being such that transversely different rates of side etching of the phase-shifting film are substantially equalized due to the reduced rate of side etching resulting from the transversely central composition, the circuit pattern including openings defined by removal of the phase-shifting film and shifters left between the openings.

The phase-shifting film may comprise a film of molybdenum silicide oxide nitride deposited by sputtering a target of molybdenum silicide with a sputtering gas containing a nitrogen mono oxide gas, and the proportion of the nitrogen mono oxide gas in the sputtering gas may be adjusted to control the transversely central composition of the phase-shifting film.

The phase-shifting film may be heated at least 200° C.

The phase-shifting film may comprise a plurality of layers successively deposited on the transparent substrate, the layers including a substantially central layer which has the transversely central composition which results in the reduced rate of side etching.

The plurality of layers may comprise first, second, and third layers, the substantially central layer comprising the second layer.

Alternatively, the plurality of layers may comprise first through ninth layers, the substantially central layer comprising the fifth layer.

The phase-shifting film may comprise a film of molybdenum silicide oxide nitride deposited by sputtering a target of molybdenum silicide with a sputtering gas containing a nitrogen mono oxide gas, and the proportion of the nitrogen mono oxide gas in the sputtering gas may be increased to produce the substantially central layer.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIGS. 2(a) through 2(c) are diagrams illustrative of an exposure process using the conventional phase-shifting photomask;

FIG. 3 is a cross-sectional view of the conventional phase-shifting photomask during the process of manufacturing the same;

DETAILED DESCRIPTION OF THE PREFERRED EMBODIMENTS

Figure 1A:
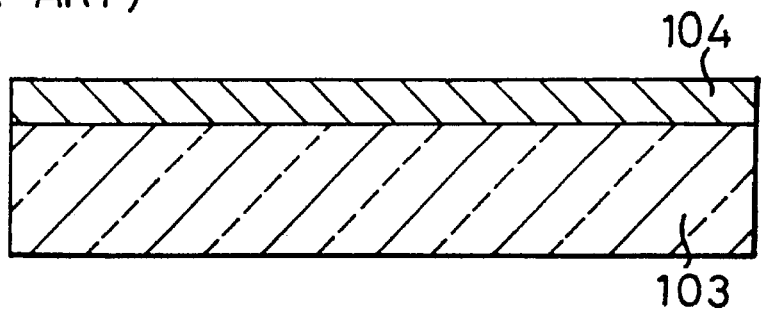
FIGS. 1(a) through 1(c) are cross-sectional views showing a process of manufacturing a conventional phase-shifting photomask.
Figure 1B:
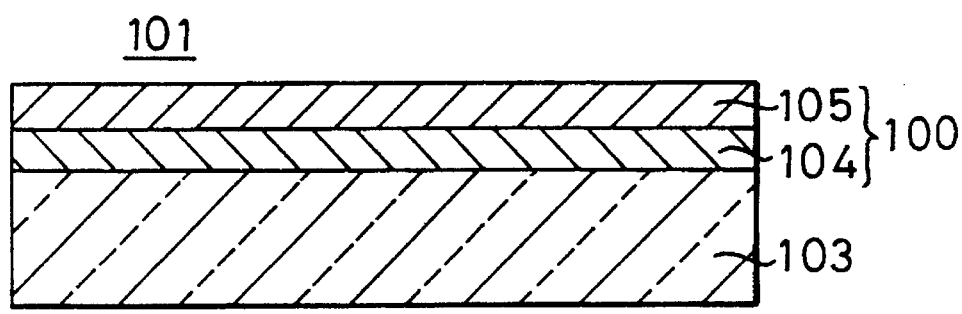
Figure 1C:
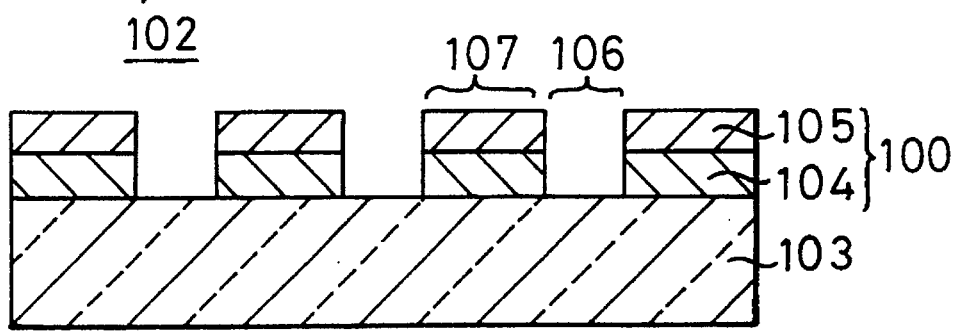
Figure 4:
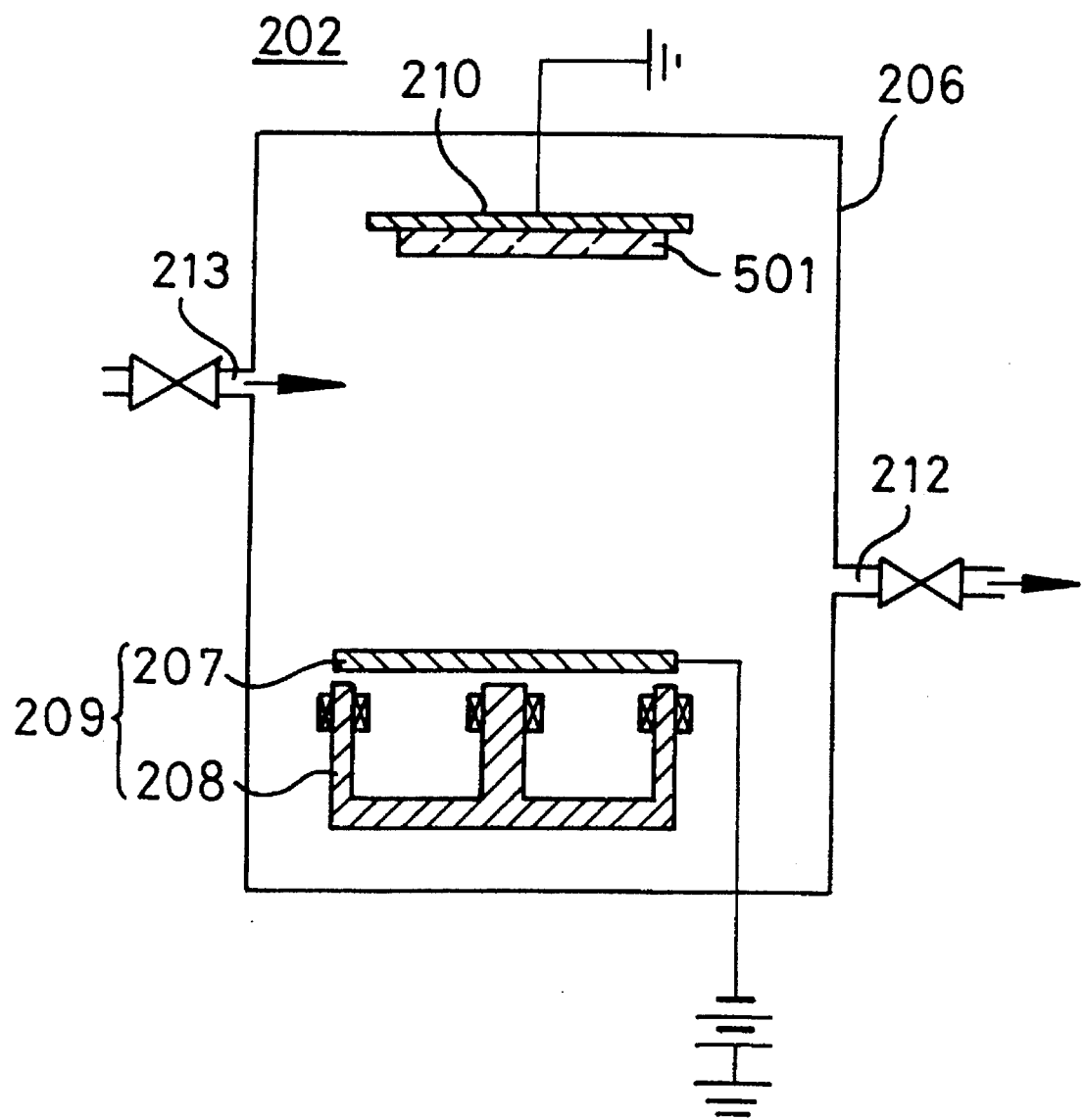
FIG. 4 is a schematic view of a DC magnetron sputtering apparatus which can be used to grow films in the present invention.

FIG. 4 schematically shows a DC magnetron sputtering apparatus 202 which can be used to grow films in the present invention.

As shown in FIG. 4, the DC magnetron sputtering apparatus 202 comprises a vacuum chamber 206 housing a magnetron cathode 209 which includes a magnet 208 and a target 207 placed on the magnet 208. The target 207 is made of molybdenum silicide where molybdenum (Mo) and silicon (Si) are coupled substantially at a ratio of 1:2.

The vacuum chamber 206 also houses an anode 210 spaced a given distance from the target 207 and kept at the ground potential. A transparent substrate 501 of quartz, which may typically be of a square shape having a thickness of 2.3 mm with each side of a length of 127 mm, is supported by a substrate holder (not shown) on the anode 210. The transparent substrate 501 has an exposed surface facing the target 207.

The substrate holder is connected to a rotatable shaft (not shown) connected to an electric motor (not shown), so that the substrate holder can be rotated about its own axis by the electric motor for uniformizing the thickness of each thin film grown on the transparent substrate 501. The substrate holder may be arranged to support 14 square transparent substrates, each having sides up to a length of 150 mm each, arrayed circumferentially about the rotatable shaft.

A gas inlet pipe 213 is connected to the vacuum chamber 206 for introducing gases from gas containers (not shown) into the vacuum chamber 206. A gas outlet pipe 212 connected to a vacuum pump (not shown) is connected to the vacuum chamber 206 for discharging gases from the vacuum chamber 206.

Examples of the present invention will be described below. In the Examples, phase-shifting photomask blanks and phase-shifting photomasks were manufactured using the DC magnetron sputtering apparatus 202 shown in FIG. 4.

FIRST EXAMPLE

After the vacuum pump connected to the gas outlet pipe 212 started to evacuate the vacuum chamber 206, the substrate holder was rotated at a rate of two revolutions per minute and the transparent substrate 501 was heated. An argon (At) gas was introduced at a rate of 128 SCCM from its gas container through the gas inlet pipe 213 and a nitrogen mono oxide (NO) gas was introduced at a rate of 3.6 SCCM from its gas container through the gas inlet pipe 213 into the vacuum chamber 206. The Ar and NO gases were mixed into a sputtering gas in which the NO gas had a volume % of 2.7%. A voltage was applied to the target 207, and the target 207 started sputtering to grow or deposit layers on the transparent substrate 501 using the sputtering gas.

The sputtering process continued for 7 minutes and 30 seconds to deposit a first layer on the transparent substrate 501. Then, a second layer was deposited on the first layer on the transparent substrate 501 under different depositing conditions. Finally, a third layer was deposited on the second layer on the transparent substrate 501 under the same conditions as when the first layer was deposited. The first, second, and third layers thus grown on the transparent substrate 501 jointly made up a phase-shifting film.

The depositing conditions for, and the thicknesses of, the first, second, and third layers are given in Table 1 below:

TABLE 1

|  | Ar gas flow rate (SCCM) | NO gas flow rate (SCCM) | NO gas volume % | Pressure (mTorr) | Voltage (V) | Current (I) | Growth time | Thickness (nm) |
| --- | --- | --- | --- | --- | --- | --- | --- | --- |
| 1st layer | 128 | 3.6 | 2.7 | 2.7 | 430 | 1.0 | 7 min. 30 sec. | 27.9 |
| 2nd layer | 176 | 7.7 | 4.2 | 3.9 | 455 | 1.0 | 16 min. 20 sec. | 67.9 |
| 3rd layer | 128 | 3.6 | 2.7 | 2.7 | 430 | 1.0 | 7 min. 30 sec. | 27.9 |

The growth rate of each of the first and third layers was about 3.7 nm/min. as derived from the thicknesses thereof. This growth rate was relatively small because these layers were deposited while the substrate holder was rotating, and is equivalent to a growth rate of 55.7 nm/min. at the time the substrate holder is at rest. The growth rate of the second layer was about 4.1 nm/min. as derived from the thicknesses thereof, and is equivalent to a growth rate of 62.0 nm/min. at the time the substrate holder is at rest.

Figure 5A:
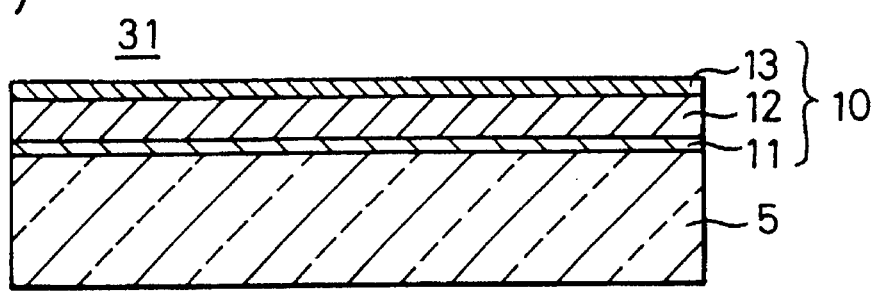
FIGS. 5(a) through 5(e) are cross-sectional views showing a process of manufacturing a phase-shifting photomask according to a first embodiment of the present invention.

The transparent substrate with the deposited phase-shifting film was then taken out of the DC magnetron sputtering apparatus 202, and then heated in a clean oven at 350° C. for 3 hours in the atmosphere, thereby producing a phase-shifting photomask blank 31 shown in FIG. 5(a). In FIG. 5(a), the transparent substrate is denoted by the reference numeral 5, the first, second, and third layers by the respective reference numerals 11, 12, 13, and the phase-shifting film by the reference numeral 10. The first, second, and third layers 11, 12, 13 were deposited successively on the transparent substrate 5 in the order named.

Figure 5B:
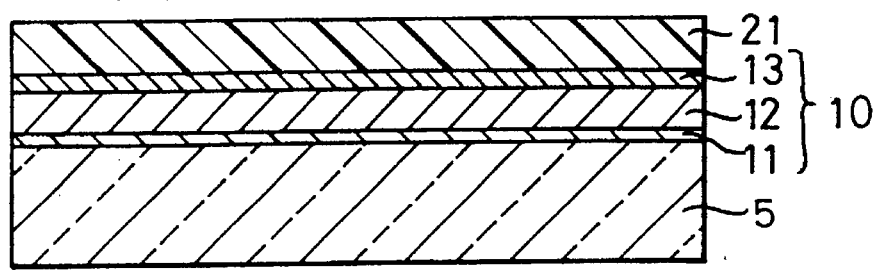
Figure 5C:
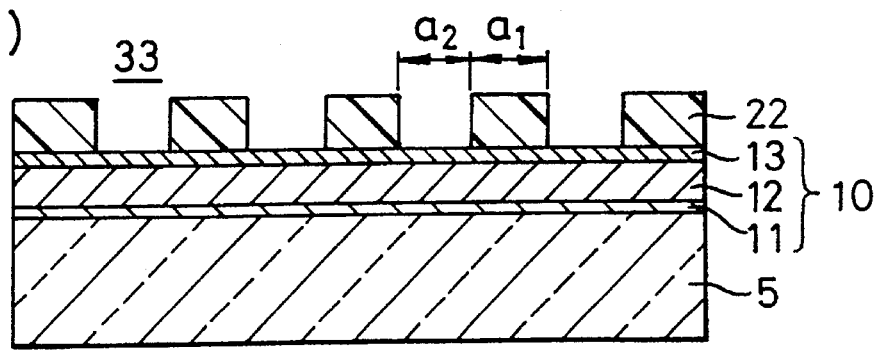

The surface of the phase-shifting photomask blank 31 was coated with a photoresist 21 as shown in FIG. 5(b), thereby producing a phase-shifting photomask blank 32. Thereafter, the phase-shifting photomask blank 32 was subjected to exposure and development, thereby producing a phase-shifting photomask blank 33 with a patterned photoresist film 22 on its surface as shown in FIG. 5(c). When a phase-shifting photomask was fabricated from the phase-shifting photomask blank, the pattern of the photoresist film 22 would serve as a pattern to be transferred onto a semiconductor substrate. The pattern of the photoresist film 22 was in the form of a line-and-space pattern composed of spaced lines each having a width $a_1$ of 4 μm and spaces alternating with the lines and each having a width $a_2$ of 4 μm.

Then, the phase-shifting photomask blank 33 was placed in an RF ion etching apparatus having a square electrode with each side having a length of 30 cm, and positioned parallel to the electrode at a distance of 60 mm therefrom. A reactive gas composed of a $CF_4$ gas and an $O_2$ gas mixed at a ratio of flow rates of 100 SCCM and 5 SCCM, respectively, was introduced into the RF ion etching apparatus. Using the patterned photoresist film 22 as a mask, the phase-shifting photomask blank 33 was selectively etched by dry etching for 5 min. and 45 sec. under a pressure of 50 Pa (0.375 Torr) and with an RF electric power of 100 W (power density of 0.11 W/cm$^2$).

Figure 5D:
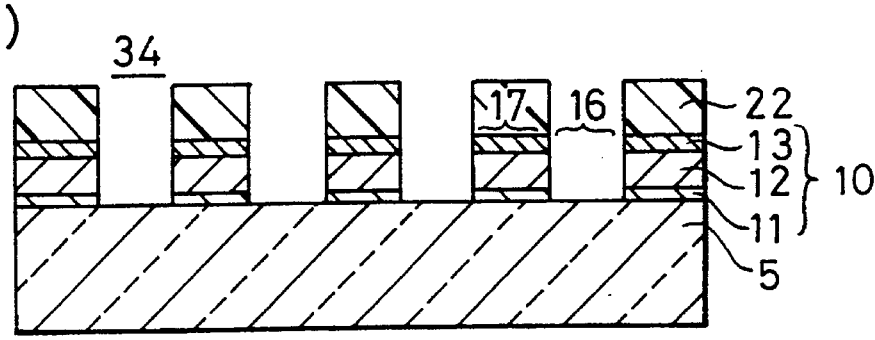
Figure 5E:
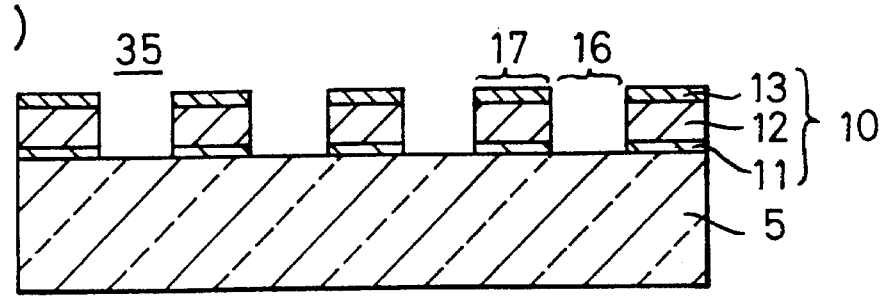

After the dry etching step, a phase-shifting photomask 34 shown in FIG. 5(d) was taken out of the RF ion etching apparatus. The phase-shifting film 10 of the phase-shifting photomask 34 had openings 16 defined by removal of the phase-shifting film 10 by the dry etching step and lands left as shifters 17 between the openings 16. The openings 16 and the shifters 17 jointly made up a pattern identical to the line-and-space pattern of the photoresist film 22.

Figure 6:
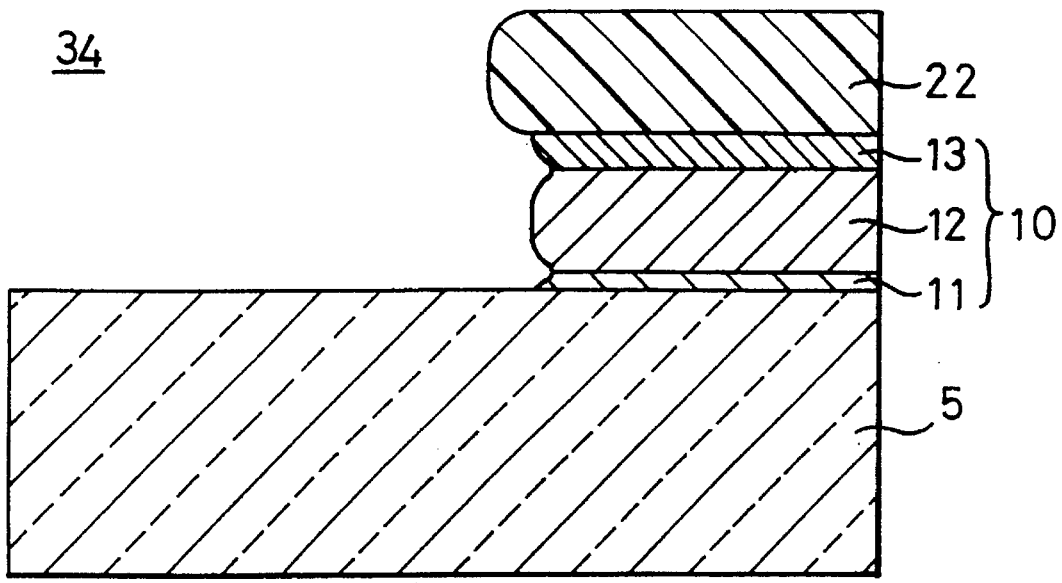
FIG. 6 is a cross-sectional view of the phase-shifting photomask shown in FIG. 5(d)

Observations of the phase-shifting photomask 34 indicated that the first layer 11, the second layer 12, and the third layer 13 were subjected to substantially equal rates of side etching, making a side surface of each of the shifters 17 substantially step-free and smooth as shown in FIG. 6. The side surface of each of the shifters 17 extended substantially perpendicularly to the transparent substrate 5.

Figure 7:
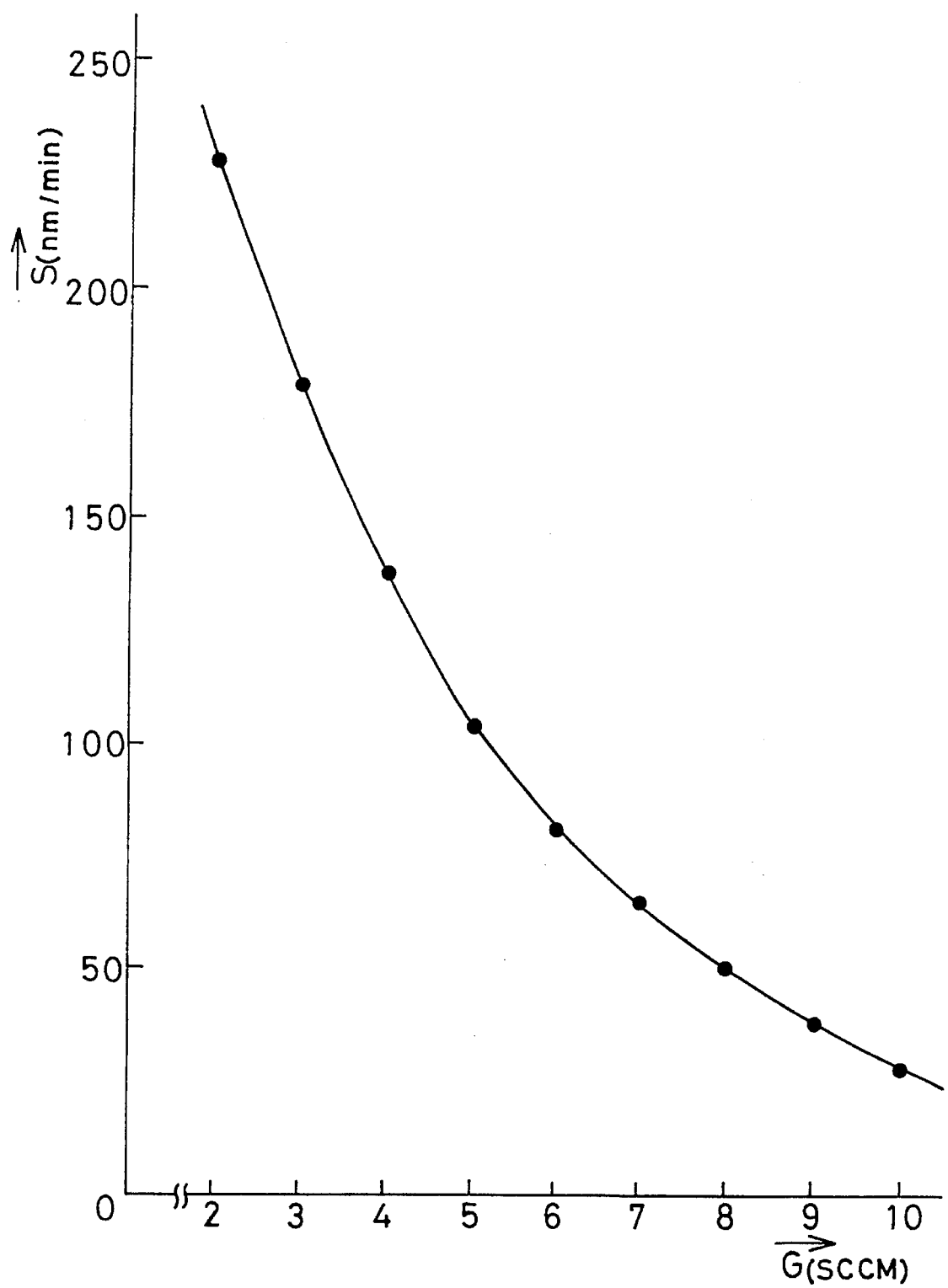
FIG. 7 is a graph showing the relationship between the added amount of a nitrogen mono oxide (NO) gas and the rate of side etching.

The reasons why the side surface of each of the shifters 17 are substantially step-free and smooth are as follows: As indicated by Table 1 above, the rate at which the NO gas was supplied to deposit the second layer 12 is greater than the rate at which the NO gas was supplied to deposit the first and third layers 11, 13. Therefore, the proportion of the NO gas added when the second layer 12 was deposited is higher than the proportion of the NO gas added when the first and third layers 11, 13 were deposited. FIG. 7 is a graph which shows the gas flow rate S (nm/min.) of side etching as it varied depending on the rate G (SCCM) at which the NO gas was added to deposit a film of molybdenum silicide oxide nitride. A study of the graph of FIG. 7 indicates that as the gas flow rate G (SCCM) and hence the proportion of the added NO gas increase, the rate S (nm/min.) of side etching decreases. Consequently, the rate of side etching of the second layer 12 is lower than the rate of side etching of the first and third layers 11, 13, compensating for the different rates of side etching which would be responsible for the recess in the concave side surface of the phase-shifting film as shown in FIG. 3. It can be seen from FIG. 7 that the rate S of side etching can be controlled by varying the proportion of the added NO gas.

When a $C_2F_6$, $C_3F_8$, $CCl_2F_2$, or $SF_6$ gas was used instead of the $CF_4$ gas, the same tendency as when the $CF_4$ gas was used was observed. When a rotating magnetic field in the range of from 1 to 160 kilogausses was applied parallel to the transparent substrate 5, the same tendency as when no rotating magnetic field was applied was observed.

When the transparent substrate with the deposited phase-shifting film was heated in the atmosphere or an atmosphere of an inert gas such as an $N_2$ gas, an Ar gas, or the like at a temperature ranging from 200° C. to 450° C. for 0.5 to 24 hours, the same tendency of the relationship between the rate G of the NO gas and the rate S of side etching as shown in FIG. 5 was observed.

Thereafter, the phase-shifting photomask 34 was processed by a photoresist removing apparatus to remove the photoresist film 22. As a result, a phase-shifting photomask 35 was produced.

The shifters 17 of the phase-shifting photomask 35 were measured for a light transmittance T. The light transmittance T of the shifters 17 was 4.9% at a wavelength of 248 nm, and 27% at a wavelength of 488 nm.

The phase-shifting photomask 35 was thereafter tested for its ability to resist chemicals in the following sequence of steps:

(1) The phase-shifting photomask 35 was immersed in concentrated sulfuric acid at 100° C. for 1 hour;

(2) The phase-shifting photomask 35 was immersed in an aqueous solution of 10 vol. % of an acid detergent (NCW acid detergent manufactured by Wako Junyaku K.K.) at room temperature for 1 hour;

(3) The phase-shifting photomask 35 was immersed in an aqueous solution of 0.5 wt. % of ammonia at room temperature for 1 hour;

(4) The phase-shifting photomask 35 was immersed in a mixture of concentrated sulfuric acid and an aqueous solution of hydrogen peroxide at 100° C. for 1 hour; and (5) The phase-shifting photomask 35 was immersed in a mixture of concentrated sulfuric acid and nitric acid at 100° C. for 1 hour.

After the phase-shifting photomask 35 was processed in the above steps (1) through (5), the light transmittance T of the shifters 17 was measured again. In a wavelength range of from 240 nm to 546 nm, the light transmittance T changed less than 0.1% from the light transmittance T prior to the above chemical-resistance test, and hence did not pose any practical problems. The phase-shifting photomask 35 had such good chemical resistance because the proportion of the NO gas added to deposit the third layer as the surface layer of the phase-shifting film 10 was small.

Generally, the optical constant L of a thin film is expressed by:

$$L = n - i \cdot k \qquad (2)$$

where n is the refractive index of the thin film, k the extinction coefficient thereof, and i the imaginary unit.

The optical coefficient $L_j$ of each layer j of a phase-shifting film composed of V layers is represented by:

$$L_j = n_j - i \cdot k_j \qquad (3)$$

where $n_j$ is the refractive index of the layer j, and $k_j$ is the extinction coefficient thereof.

If the refractive index of the medium is indicated by $n_0$, the wavelength of measuring light by $\lambda$, and the thickness of each layer j by $d_j$, then the phase-shifting angle $\phi_v$ of the phase-shifting film composed of V layers is determined by the following equation (4)

$$\phi_V = \sum_{j=1}^{V} 2\pi \cdot (n_j - n_0) \cdot d_j / \lambda \qquad (4)$$

The entire thickness $d_v$ of the phase-shifting film composed of V layers is determined by the following equation (5):

$$d_V = \sum_{j=1}^{V} d_j \qquad (5)$$

Values in Table 1 above were put in the equations (4), (5), and the phase-shifting angle $\phi$ and the thickness d of the phase-shifting film 10 were calculated at the wavelength of 248 nm. As a result, the phase-shifting angle $\phi$ and the thickness d of the phase-shifting film 10 were 186.6° and 123.3 nm, respectively.

When the transmittances T of the phase-shifting film 10 at the wavelengths of 248 nm and 488 nm, respectively, were calculated from values in Table 2, given below, they were 4.70% and 26.44%, respectively, which were close to actually measured values.

SECOND EXAMPLE

In order to determine the optical constant L of a phase-shifting film composed of a number of layers, five different sputtering gases composed of mixtures of NO gases supplied at respective rates of 3.6, 4.0, 5.0, 6.0, and 7.7 SCCM and Ar gases supplied at respective rates ranging from 128 to 176 SCCM were introduced into the DC magnetron sputtering apparatus 202, and a target of molybdenum silicide in the DC magnetron sputtering apparatus 202 was subjected to sputtering to grow or deposit single layers of molybdenum silicide oxide nitride of a single composition on a transparent substrate of quartz. The refractive index n and the extinction coefficient k of each of the deposited single layers were measured. The measured refractive indexes n and the extinction coefficients k are given in Table 2 below.

TABLE 2

| NO gas flow rate (SCCM) | Wavelength: 248 nm | | Wavelength: 488 nm | |
| --- | --- | --- | --- | --- |
| | Refractive index n | Extinction coefficient k | Refractive index n | Extinction coefficient k |
| 3.6 | 2.180 | 0.5879 | 2.238 | 0.4653 |
| 4.0 | 1.855 | 0.6285 | 2.043 | 0.4434 |
| 5.0 | 1.978 | 0.5528 | 2.355 | 0.3447 |
| 6.0 | 1.799 | 0.3687 | 2.008 | 0.2012 |
| 7.7 | 1.868 | 0.3385 | 1.972 | 0.1964 |

Figure 8A:
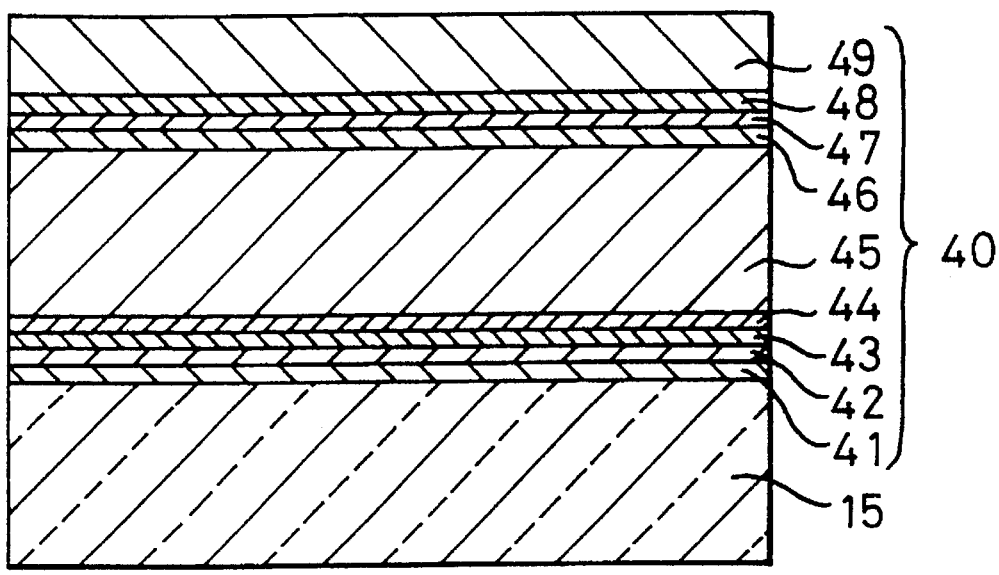
FIGS. 8(a) and 8(b) are cross-sectional views showing a process of manufacturing a phase-shifting photomask according to a second embodiment of the present invention.

Using the DC magnetron sputtering apparatus 202, as shown in FIG. 8(a), first through ninth layers 41–49 were deposited successively in the order named on a transparent substrate 15 of quartz by way of sputtering under a pressure ranging from 3 to 4 mTorr with a voltage ranging from 430 to 455 V and a current of 1.0 A. The proportion of the added NO gas was increased successively from the first through fifth layers 41–45 to increase the vol. % of the NO gas from 2.7% to 4.2%. The proportion of the added NO gas was reduced successively from the fifth through ninth layers 45–49 to reduce the vol. % of the NO gas from 4.2% to 2.7%. The first through ninth layers 41–49 thus grown jointly made up a phase-shifting film 40. The assembly was then heated in a clean oven at 350° C. for 3 hours, thereby producing a phase-shifting photomask blank 37.

The flow rates of the NO gas supplied when the first through ninth layers 41–49 were deposited, the thicknesses of these layers, the refractive indexes n and the extinction coefficients k of these layers at the wavelengths of 248 nm and 488 nm as determined by interpolation from the values in Table 2 are given in Table 3 below.

TABLE 3

| | NO gas flow rate (SCCM) | NO gas volume (%) | Thickness (nm) | 248 nm | | 488 nm | |
| --- | --- | --- | --- | --- | --- | --- | --- |
| | | | | n | k | n | k |
| 1st layer | 3.6 | 2.7 | 5.57 | 2.180 | 0.5879 | 2.238 | 0.4653 |
| 2nd layer | 4.6 | | 5.57 | 1.942 | 0.5748 | 2.264 | 0.3733 |
| 3rd layer | 5.6 | | 6.14 | 1.885 | 0.4571 | 2.174 | 0.2701 |
| 4th layer | 6.65 | | 6.14 | 1.860 | 0.3419 | 1.976 | 0.1969 |
| 5th layer | 7.7 | 4.2 | 63.5 | 1.868 | 0.3385 | 1.972 | 0.1964 |
| 6th layer | 6.65 | | 6.14 | 1.860 | 0.3419 | 1.976 | 0.1969 |
| 7th layer | 5.6 | | 6.14 | 1.885 | 0.4571 | 2.174 | 0.2701 |
| 8th layer | 4.6 | | 5.57 | 1.942 | 0.5748 | 2.264 | 0.3733 |
| 9th layer | 3.6 | 2.7 | 24.1 | 2.180 | 0.5879 | 2.238 | 0.4653 |

Since the pairs of the first and ninth layers 41, 49, the second and eighth layers 42, 48, the third and seventh layers 43, 47, and the fourth and sixth layers 44, 46 were deposited under the same conditions, the layers of these pairs had the same compositions, the same thicknesses, and the same optical constants.

The growth rates determined from the thicknesses of the first through ninth layers 41–49 were in the range of from 3.7 to 4.2 nm/min. because the transparent substrate 15 was rotating when the first through ninth layers 41–49 were deposited. These growth rates in the range of from 3.7 to 4.2 nm/min. are equivalent to respective growth rates in the range of from 56 to 63 nm/min. at the time the substrate holder is at rest.

Then, after a patterned photoresist film was deposited on the phase-shifting photomask blank 37, the phase-shifting photomask blank 37 was selectively etched by dry etching using the same RF ion etching apparatus as and under the same etching conditions as with the First Example, except that the phase-shifting photomask blank 37 was selectively etched for 6 minutes. As a result, a phase-shifting photomask 38 with shifters 27 left beneath a patterned photoresist film 23 was produced as shown in FIG. 9.

Figure 9:
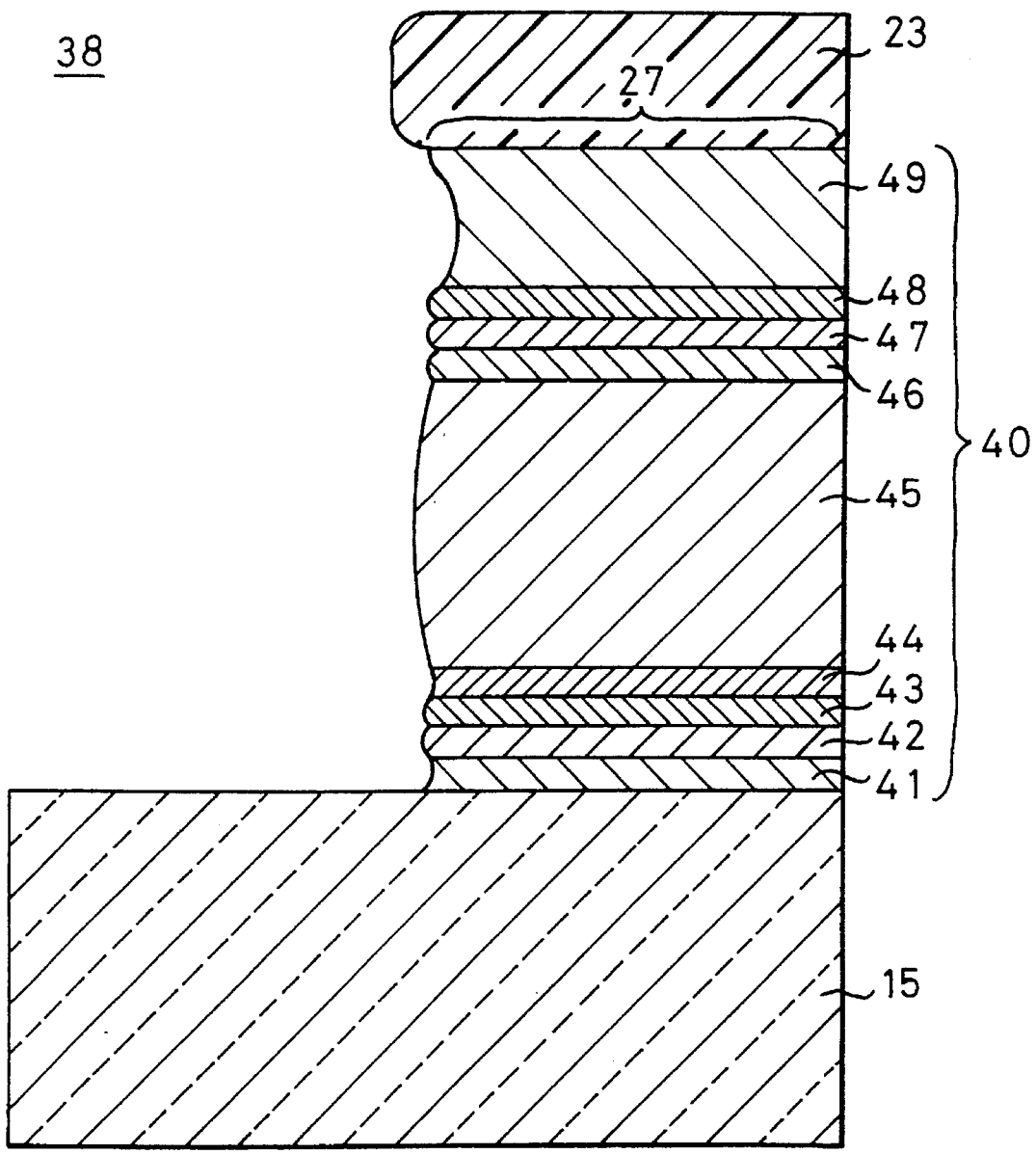
FIG. 9 is a cross-sectional view of the phase-shifting photomask according to the second embodiment during the process of manufacturing the same.

When the phase-shifting photomask 38 was observed, the first through ninth layers 41–49 were subjected to substantially equal rates of side etching, making a side surface of each of the shifters 27 substantially step-free and smooth as shown in FIG. 9. The side surface of each of the shifters 27 extended substantially perpendicularly to the transparent substrate 15.

Figure 8B:
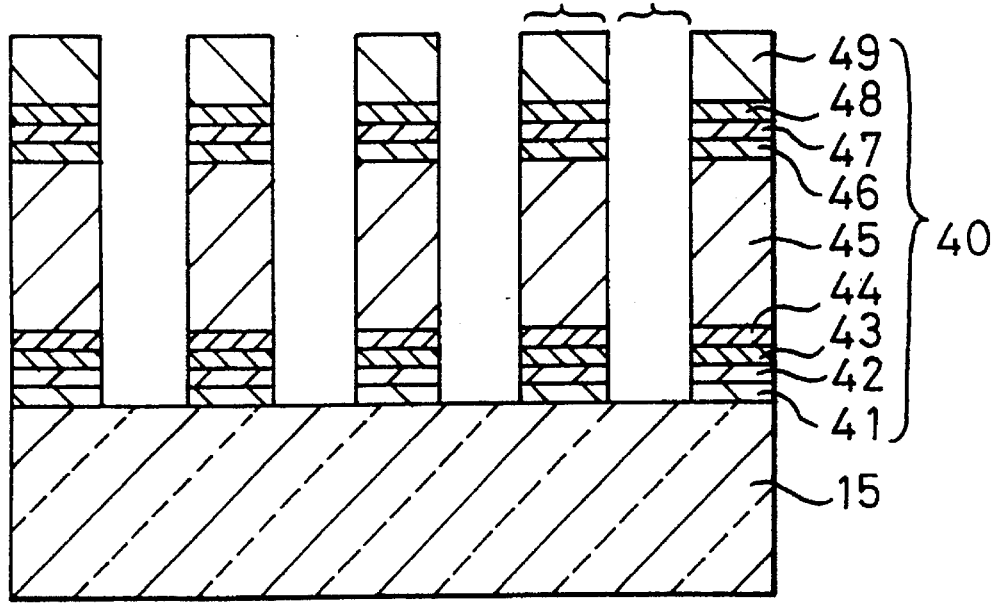

Then, the photoresist film 23 on the surface of the phase-shifting photomask 38 was removed. As a consequence, a phase-shifting photomask 39 was produced which had a circuit pattern composed of the shifters 27 and openings 26 defined between the shifters 27, as shown in FIG. 8(b).

The measured light transmittances T of the phase-shifting photomask blank 37 and the shifters 27 of the phase-shifting photomask 39 at the respective wavelengths of 248 nm and 488 nm were 4.8% and 28%, respectively, which were in good agreement with their light transmittances T of 4.62% and 28.48% calculated from values in Table 3.

The phase-shifting angle φ and the thickness d of the phase-shifting film 40 were calculated at the wavelengths of 248 nm, 488 nm according to the equations (4), (5). As a result, the phase-shifting angle φ and the thickness d of the phase-shifting film 40 were 179.8° and 130.9 nm, respectively, which were close to measured values.

As with the First Example, the phase-shifting photomask blank 37 was tested for chemical resistance according to the steps (1) through (5) described above and then measured for the light transmittance T. In a wavelength range of from 240 nm to 546 nm, the light transmittance T changed less than 0.1% from the light transmittance T prior to the above chemical-resistance test, and hence did not pose any practical problems.

In each of the First and Second Examples, the assembly was heated at 350° C. for 3 hours after the phase-shifting films 10, 40 were deposited. A phase-shifting photomask blank which was heated at 250° C. for 1 hour was also tested for chemical resistance according to the steps (1) through (5) described above and then measured for the light transmittance T. In a wavelength range of from 240 nm to 546 nm, the light transmittance T of such a phase-shifting photomask blank also changed less than 0.1% from the light transmittance T prior to the above chemical-resistance test, and hence did not pose any practical problems.

In each of the First and Second Examples, when the phase-shifting film was deposited by sputtering, the NO gas supplied at a flow rate ranging from 3.6 to 7.7 SCCM, i.e., a volume % ranging from 2.7 to 4.2%, was added to the Ar gas. However, the NO gas may be added in any of various rates such as shown in FIG. 7. For desired chemical resistance, the surface layer of the phase-shifting film should preferably be deposited with the NO gas added in a relatively small proportion.

In each of the First and Second Examples, the NO gas was added to the Ar gas. However, the present invention is not limited to such a combination. Instead, the NO gas may be added to a neon (Ne) gas, a krypton (Kr) gas, a xenon (Xe) gas, or a combination of these gases.

The phase-shifting films according to the First and Second Examples comprised a multi-layer structure composed of three layers and nine layers, respectively, made of molybdenum silicide oxide nitride (MoSiON). However, the phase-shifting film according to the present invention may be of a multi-layer structure composed of plural layers ranging from 4 to 8 layers or 10 or more layers, or may alternatively have a continuously varying composition. The phase-shifting film according to the present invention is not limited to a film of molybdenum silicide oxide nitride, but may comprise one or more a film of chromium (Cr), molybdenum (Mo), tantalum (Ta), niobium (Nb), tungsten (W), halfnium (Hf), chromium silicide (Cr·Si ), molybdenum silicide (Mo·Si), tantalum silicide (Ta·Si), niobium silicide (Nb·Si), tungsten silicide (W·Si), or halfnium silicide (Hf·Si), or alternatively a film of an oxide of any of these materials, a film of a nitride of any of these materials, a film of a carbide of any of these materials, a film of an oxide nitride of any of these materials, or a film of an oxide nitride carbide of any of these materials.

It has been confirmed that a phase-shifting film fabricated using an RF magnetron sputtering apparatus has substantially uniform rates of side etching in the transverse direction thereof. The sputtering apparatus that can be used to deposit phase-shifting film layers is therefore not limited to the DC magnetron sputtering apparatus, but may be an RF magnetron sputtering apparatus, any of various other sputtering apparatus, or any of various film depositing apparatus that operate on other principles.

The optical characteristics of the phase-shifting photomasks in the First and Second Examples were measured at the wavelength of 248 nm as one of the measuring wavelengths on the assumption that a subsequent exposure process would be carried out on the phase-shifting photomasks using a KrF excimer laser which emits a laser beam having a wavelength of 248 nm. However, rays of exposure light that can be used with the phase-shifting photomask according to the present invention is not limited to that wavelength, but may be rays of i-line exposure light or exposure light of shorter wavelengths.

Although certain preferred embodiments of the present invention have been shown and described in detail, it should be understood that various changes and modifications may be made therein without departing from the scope of the appended claims.

What is claimed is:

1. A method of manufacturing a phase-shifting photomask blank, comprising the steps of:

depositing a phase-shifting film on a transparent substrate such that the phase-shifting film includes a transversely central composition;

reducing the rate of side etching of the transversely central composition;

masking the phase-shifting film with a patterned photoresist film; and dry-etching said phase-shifting film through said patterned photoresist film while substantially equalizing transversely different rates of side etching of the phase-shifting film due to said reduced rate of side etching resulting from said transversely central composition.

2. A method according to claim 1, wherein said step of depositing comprises the steps of:

sputtering a target of molybdenum silicide with a sputtering gas containing a nitrogen mono oxide gas to deposit a film of molybdenum silicide oxide nitride on said transparent substrate; and adjusting the proportion of said nitrogen mono oxide gas in said sputtering gas to control said transversely central composition of the phase-shifting film.

3. A method according to claim 1 or 2, further comprising the step of:

heating said phase-shifting film at least 200° C.

4. A method according to claim 1, wherein said step of depositing comprises the step of:

depositing a plurality of layers successively on said transparent substrate, said layers including a substantially central layer which has said transversely central composition which results in said reduced rate of side etching.

5. A method according to claim 4, wherein said plurality of layers comprise first, second, and third layers, said substantially central layer comprising the second layer.

6. A method according to claim 4, wherein said plurality of layers comprise first through ninth layers, said substantially central layer comprising the fifth layer.

7. A method according to claim 4, wherein said step of depositing comprises the steps of:

sputtering a target of molybdenum silicide with a sputtering gas containing a nitrogen mono oxide gas to deposit each of said plurality of layers as a film of molybdenum silicide oxide nitride on said transparent substrate; and increasing the proportion of said nitrogen mono oxide gas in said sputtering gas to produce said substantially central layer.

8. A phase-shifting photomask blank, comprising:

a transparent substrate;

a phase shifting film deposited on said transparent substrate, said phase-shifting film including a transversely central composition which results in a reduced rate of side etching; and a patterned photoresist film masking said phase-shifting film, wherein the phase shifting film is capable of being dry-etched through said patterned photoresist film and receiving substantially equalized transversely different rates of side etching due to said reduced rate of side etching resulting from said transversely central composition.

9. A phase-shifting photomask blank according to claim 8, wherein said phase-shifting film comprises a film of molybdenum silicide oxide nitride deposited by sputtering a target of molybdenum silicide with a sputtering gas containing a nitrogen mono oxide gas, the arrangement being such that the proportion of said nitrogen mono oxide gas in said sputtering gas is adjusted to control said transversely central composition of the phase-shifting film.

10. A phase-shifting photomask blank according to claim 8 or 9, wherein said phase-shifting film is heated at at least 200° C.

11. A phase-shifting photomask blank according to claim 8, wherein said phase-shifting film comprises a plurality of layers successively deposited on said transparent substrate, said layers including a substantially central layer which has said transversely central composition which results in said reduced rate of side etching.

12. A phase-shifting photomask blank according to claim 11, wherein said plurality of layers comprise first, second, and third layers, said substantially central layer comprising the second layer.

13. A phase-shifting photomask blank according to claim 11, wherein said plurality of layers comprise first through ninth layers, said substantially central layer comprising the fifth layer.

14. A phase-shifting photomask blank according to claim 11, wherein said phase-shifting film comprises a film of molybdenum silicide oxide nitride deposited by sputtering a target of molybdenum silicide with a sputtering gas containing a nitrogen mono oxide gas, the arrangement being such that the proportion of said nitrogen mono oxide gas in said sputtering gas is increased to produce said substantially central layer.

15. A method of manufacturing a phase-shifting photomask, comprising the steps of:

depositing a phase-shifting film on a transparent substrate such that the phase-shifting film includes a transversely central composition;

reducing the rate of side etching of the transversely central composition;

masking the phase-shifting film with a patterned photoresist film; and dry-etching said phase-shifting film through said patterned photoresist film into a circuit pattern to be transferred onto a wafer, while substantially equalizing transversely different rates of side etching of the phase-shifting film due to said reduced rate of side etching resulting from said transversely central composition;

said circuit pattern including openings defined by removal of said phase-shifting film and shifters left between said openings.

16. A method according to claim 15, wherein said step of depositing comprises the steps of:

sputtering a target of molybdenum silicide with a sputtering gas containing a nitrogen mono oxide gas to deposit a film of molybdenum silicide oxide nitride on said transparent substrate; and adjusting the proportion of said nitrogen mono oxide gas in said sputtering gas to control said transversely central composition of the phase-shifting film.

17. A method according to claim 15 or 16, further comprising the step of:

heating said phase-shifting film at at least 200° C.

18. A method according to claim 15, wherein said step of depositing comprises the step of:

depositing a plurality of layers successively on said transparent substrate, said layers including a substantially central layer which has said transversely central composition which results in said reduced rate of side etching.

19. A method according to claim 18, wherein said plurality of layers comprise first, second, and third layers, said substantially central layer comprising the second layer.

20. A method according to claim 18, wherein said plurality of layers comprise first through ninth layers, said substantially central layer comprising the fifth layer.

21. A method according to claim 18, wherein said step of depositing comprises the steps of:

sputtering a target of molybdenum silicide with a sputtering gas containing a nitrogen mono oxide gas to deposit each of said plurality of layers as a film of molybdenum silicide oxide nitride on said transparent substrate; and increasing the proportion of said nitrogen mono oxide gas in said sputtering gas to produce said substantially central layer.

22. A phase-shifting photomask, comprising:

a transparent substrate; and a phase-shifting film deposited on said transparent substrate, said phase-shifting film including a transversely central composition which results in a reduced rate of side etching, said phase-shifting film being dry-etched, while being masked by a patterned photoresist film, into a circuit pattern to be transferred onto a wafer, wherein the phase-shifting film is capable of receiving substantially equalized transversely different rates of side etching due to said reduced rate of side etching resulting from said transversely central composition, and said circuit pattern including openings defined by removal of said phase-shifting film and shifters left between said openings.

23. A phase-shifting photomask according to claim 22, wherein said phase-shifting film comprises a film of molybdenum silicide oxide nitride deposited by sputtering a target of molybdenum silicide with a sputtering gas containing a nitrogen mono oxide gas, the arrangement being such that the proportion of said nitrogen mono oxide gas in said sputtering gas is adjusted to control said transversely central composition of the phase-shifting film.

24. A phase-shifting photomask according to claim 22 or 23, wherein said phase-shifting film is heated at at least 200° C.

25. A phase-shifting photomask according to claim 22, wherein said phase-shifting film comprises a plurality of layers successively deposited on said transparent substrate, said layers including a substantially central layer which has said transversely central composition which results in said reduced rate of side etching.

26. A phase-shifting photomask blank according to claim 25, wherein said plurality of layers comprise first, second, and third layers, said substantially central layer comprising the second layer.

27. A phase-shifting photomask blank according to claim 25, wherein said plurality of layers comprise first through ninth layers, said substantially central layer comprising the fifth layer.

28. A phase-shifting photomask blank according to claim 25, wherein said phase-shifting film comprises a film of molybdenum silicide oxide nitride deposited by sputtering a target of molybdenum silicide with a sputtering gas containing a nitrogen mono oxide gas, the arrangement being such that the proportion of said nitrogen mono oxide gas in said sputtering gas is increased to produce said substantially central layer.

* * * * *